(12) United States Patent
Sheen et al.

(10) Patent No.: US 11,757,436 B2
(45) Date of Patent: Sep. 12, 2023

(54) SYSTEM FOR SIGNAL PROPAGATION AND METHOD OF OPERATING THE SAME

(71) Applicant: TAIWAN SEMICONDUCTOR MANUFACTURING COMPANY LTD., Hsinchu (TW)

(72) Inventors: Ruey-Bin Sheen, Taichung (TW); Tsung-Hsien Tsai, Taoyuan County (TW); Chih-Hsien Chang, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 2 days.

(21) Appl. No.: 17/461,450

(22) Filed: Aug. 30, 2021

(65) Prior Publication Data
US 2023/0061783 A1 Mar. 2, 2023

(51) Int. Cl.
*H03K 5/01* (2006.01)
*H03L 7/08* (2006.01)

(52) U.S. Cl.
CPC ........... *H03K 5/01* (2013.01); *H03L 7/08* (2013.01)

(58) Field of Classification Search
None
See application file for complete search history.

(56) References Cited

U.S. PATENT DOCUMENTS

| | | | | |
|---|---|---|---|---|
| 5,542,083 A | * | 7/1996 | Hotta | G06F 1/10 713/375 |
| 7,692,983 B2 | * | 4/2010 | Lee | G06F 13/1684 333/32 |
| 7,945,228 B2 | * | 5/2011 | Fujii | H04B 15/06 455/313 |
| 8,659,706 B2 | * | 2/2014 | Carwana | H04N 5/45 348/565 |
| 2009/0079506 A1 | * | 3/2009 | Wu | H03L 7/095 331/11 |

OTHER PUBLICATIONS

U.S. Appl. No. 17/349,991 entitled "Programmable Regulator Voltage Controlled Ring Oscillator" and filed Jun. 17, 2021.

* cited by examiner

*Primary Examiner* — Cassandra F Cox
(74) *Attorney, Agent, or Firm* — WPAT LAW; Anthony King

(57) ABSTRACT

An electrical system is provided. The electrical system comprises a first phase lock circuit embedded within a first chip for receiving a first periodic signal having a first frequency. The electrical system comprises a first buffering circuit embedded within the first chip for receiving a second periodic signal having the first frequency, wherein the first buffering circuit is configured to provide a third periodic signal having the first frequency to an output terminal of the first chip.

20 Claims, 14 Drawing Sheets

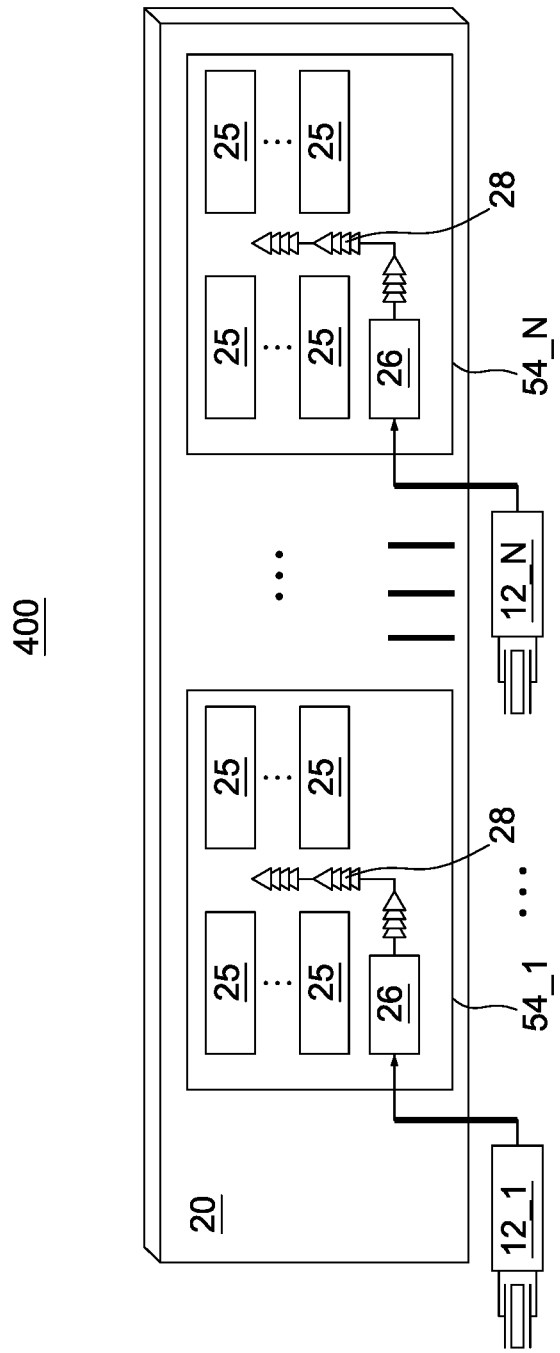

SYSTEM FOR SIGNAL PROPAGATION AND METHOD OF OPERATING THE SAME

BACKGROUND

The present disclosure relates, in general, to a system for signal propagation and methods of operating the same. Specifically, the present disclosure relates to a long-distance clock signal generation/propagation for 2.5D or 3D integrated circuit (IC) systems.

With the rapid growth in wafer level package technologies, more chips/dies with different functions can be packed together within a CPU, a GPU or a Memory in order to support high-performance applications. Those chips can be manufactured with different technologies (such as 3 nm, 5 nm, or 7 nm, etc.) and then be packed using 2.5D or 3D packaging technology. In order to cover comprehensive functions in the 2.5D/3D packaging system, multiple clocks may be needed for fulfilling the targeted operation frequencies and/or jitter requirements. A large number of clocks in 2.5D/3D packaging systems can be area-consuming, and may also consume excess energy during the operations of the systems. In addition, degradation of clock quality may occur due to noise coupling and the long distribution distance across chips/dies.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 10A illustrates a schematic view of a system, in accordance with some comparative embodiments of the present disclosure.

DETAILED DESCRIPTION

Figure 1:
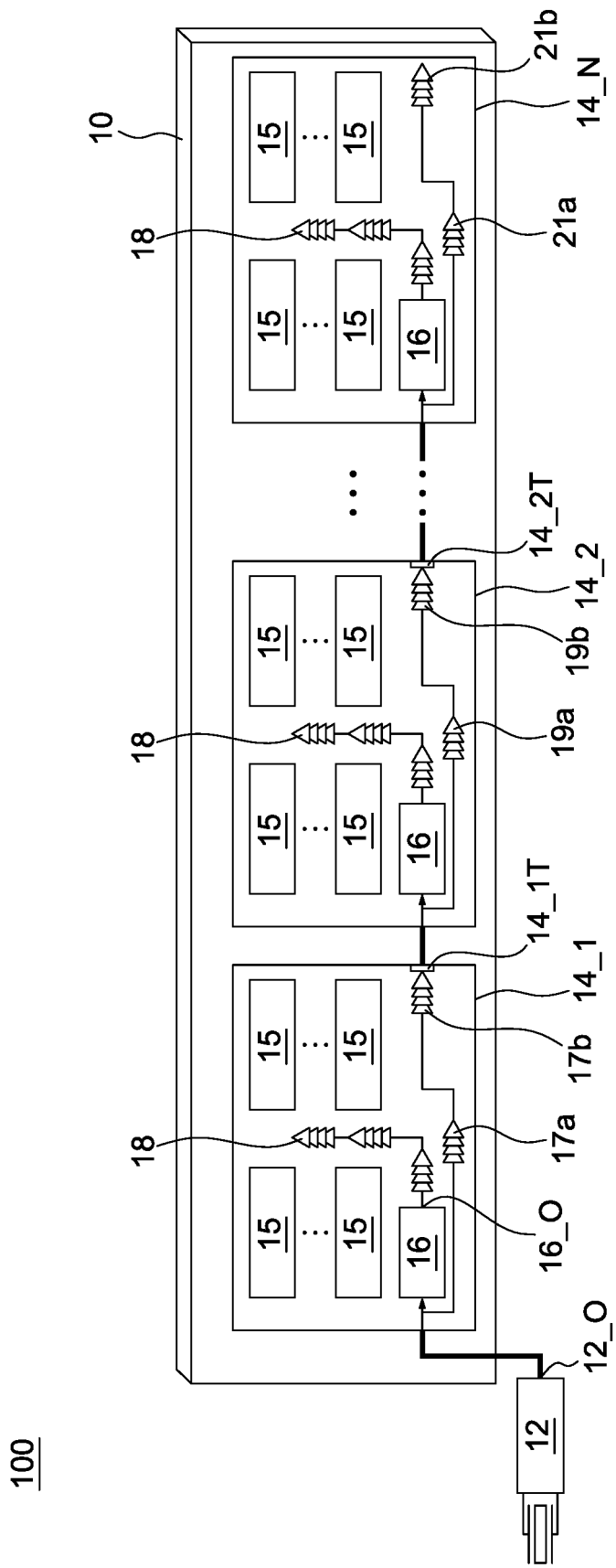
FIG. 1 illustrates a schematic view of a system, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A technology to provide clocks that can support long-distance distribution with low-jitter and low-power consumption is hereby illustrated.

FIG. 1 illustrates a schematic view of a system, in accordance with some embodiments of the present disclosure.

FIG. 1 shows a system 100. The system 100 can be an electrical system. The system 100 can be a system of integrated circuits (IC). The system 100 can be a system deployed using 2.5D packaging technology. The system 100 includes a signal source 12. The signal source 12 can be a source of a clock signal. The signal source 12 can be a source of a periodic signal. The signal source 12 can be a clock generator.

The system 100 includes a circuit board 10. The circuit board 10 can also be referred to as an interposer. The system 100 includes chips 14_1, 14_2, ..., 14_N disposed on the circuit board 10. The chips 14_1, 14_2, ..., 14_N can be electrically connected with each other.

Signals/commands/messages can be transmitted between chips 14_1, 14_2, ..., 14_N. Each of the chips 14_1, 14_2, ..., 14_N can be of different functionalities. Some of the chips 14_1, 14_2, ..., 14_N can be of identical or similar functionalities.

The chip 14_1 may include a plurality of systems 15. Each of the systems 15 can be of different functionalities. Some of the systems 15 can be of identical or similar functionalities. The chip 14_1 may include a phase lock circuit 16. The phase lock circuit 16 can be a circuit that is configured to generate an output signal whose phase is related to the phase of an input signal. The phase lock circuit 16 can be configured to receive the output signal 12_O of the signal source 12 and then provide an output signal 16_O. The output signal 16_O can have a frequency different from that of the output signal 12_O. The output signal 16_O can have a frequency greater than that of the output signal 12_O. The frequency of the output signal 16_O can be a multiple of that of the output signal 12_O.

The output signal 12_O can be provided to the circuit board 10 through, for example, distribution traces or through silicon vias (TSV).

The chip 14_1 may include a plurality of buffering circuits 18. The buffering circuits 18 can be electrically connected between the phase lock circuit 16 and the systems 15. The buffering circuits 18 can be configured to amplify the amplitudes of the output signal 16_O before providing the output signal 16_O to the systems 15. The buffering circuits 18 may facilitate maintaining the slew rate of the output signal 16_O before the output signal 16_O is provided to the systems 15.

The chip 14_1 may include buffering circuits 17a and 17b. The buffering circuits 17a and 17b can be electrically connected between the signal source 12 and the chip 14_2. The buffering circuits 17a and 17b can be configured to amplify the amplitudes of the output signal 12_O before providing the output signal 12_O to the chip 14_2. The buffering circuits 17a and 17b may facilitate maintaining the slew rate of the output signal 12_O before the output signal 12_O is provided to the chip 14_2.

The frequency of an output signal of the buffering circuit 17a can be substantially identical to that of an input signal of the buffering circuit 17a. The frequency of an output signal of the buffering circuit 17b can be substantially identical to that of an input signal of the buffering circuit 17b. Although two buffering circuits (i.e., 17a and 17b) are depicted in FIG. 1, it can be contemplated that the chip 14_1 may include more than two buffering circuits, or include only one buffering circuit, between the signal source 12 and the chip 14_2.

The buffering circuit 17a can be configured to provide a signal to an output terminal 14_1T of the chip 14_1. The buffering circuit 17b can be configured to provide a signal to an output terminal 14_1T of the chip 14_1. The signal provided at the output terminal 14_1T will be received by the chip of the next stage (i.e., the chip 14_2).

The chip 14_2 may include components similar to those of the chip 14_1. The chip 14_2 may include a plurality of systems 15. Each of the systems 15 can be of different functionalities. Some of the systems 15 can be of identical or similar functionalities. The chip 14_1 may further include a phase lock circuit 16 and a plurality of buffering circuits 18. The chip 14_1 may further include buffering circuits 19a and 19b. The buffering circuits 19a and 19b can be configured to amplify the amplitudes of the signals received from the chip 14_1. The buffering circuits 19a and 19b can be configured to maintain the slew rate of the signals received from the chip 14_1.

The frequency of an output signal of the buffering circuit 19a can be substantially identical to that of an input signal of the buffering circuit 19a. The frequency of an output signal of the buffering circuit 19b can be substantially identical to that of an input signal of the buffering circuit 19b. Although two buffering circuits (i.e., 19a and 19b) are depicted in FIG. 1, it can be contemplated that the chip 14_2 may include more than two buffering circuits, or include only one buffering circuit, between the chip 14_2 and the chip of a next stage (i.e., 14_3, not shown in FIG. 1).

The buffering circuit 19a can be configured to provide a signal to an output terminal 14_2T of the chip 14_2. The buffering circuit 19b can be configured to provide a signal to an output terminal 14_2T of the chip 14_2. The signal provided at the output terminal 14_2T will be received by the chip of the next stage (i.e., the chip 14_3, not shown in FIG. 1).

The chip 14_N may include components similar to those of the chip 14_1. The chip 14_N may include a plurality of systems 15. Each of the systems 15 can be of different functionalities. Some of the systems 15 can be of identical or similar functionalities. The chip 14_N may further include a phase lock circuit 16 and a plurality of buffering circuits 18. The chip 14_N may further include buffering circuits 21a and 21b. The buffering circuits 21a and 21b can be configured to amplify the amplitudes of the signals received from the chip of a previous stage (i.e., 14_(N-1), not shown in FIG. 1). The buffering circuits 21a and 21b can be configured to maintain the slew rate of the signals received from the chip of a previous stage.

The frequency of an output signal of the buffering circuit 21a can be substantially identical to that of an input signal of the buffering circuit 21a. The frequency of an output signal of the buffering circuit 21b can be substantially identical to that of an input signal of the buffering circuit 21b.

Figure 2:
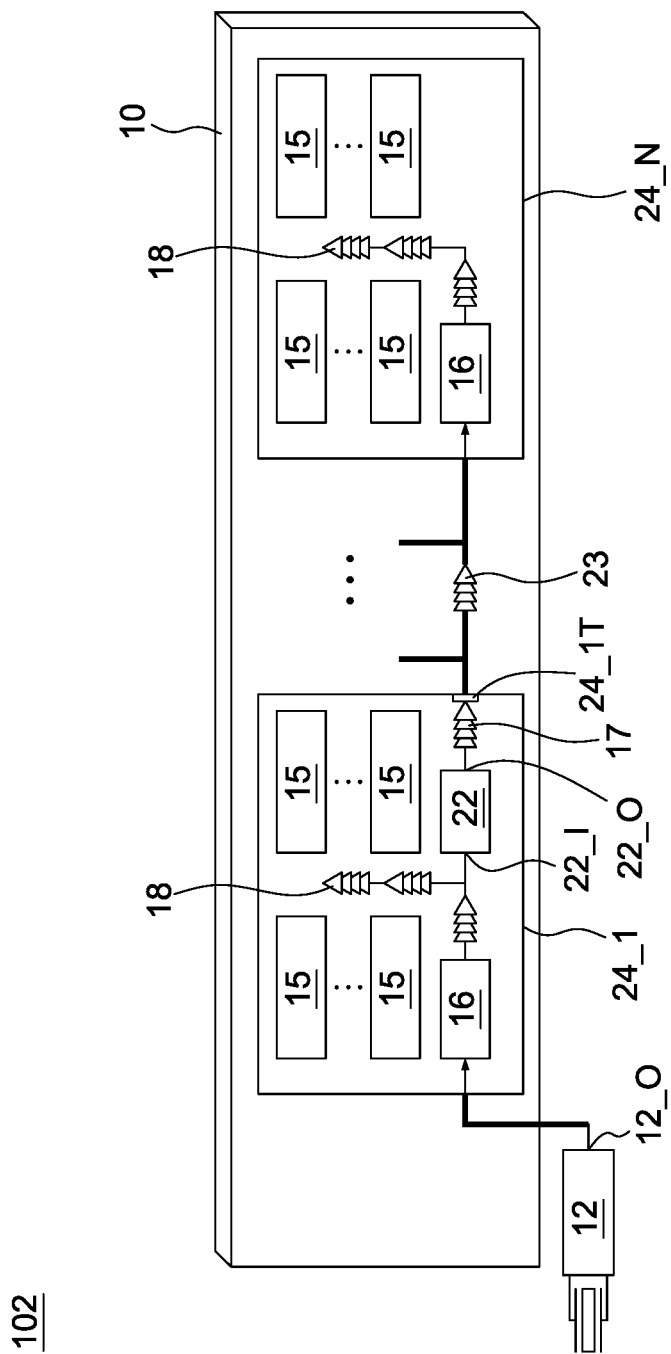
FIG. 2 illustrates a schematic view of a system, in accordance with some embodiments of the present disclosure.

FIG. 2 illustrates a schematic view of a system, in accordance with some embodiments of the present disclosure.

FIG. 2 shows a system 102. The system 102 can be an electrical system. The system 102 can be a system of ICs. The system 102 can be a system deployed using 2.5D packaging technology. The system 102 includes a signal source 12. The signal source 12 can be a source of a clock signal. The signal source 12 can be a source of a periodic signal. The signal source 12 can be a clock generator.

The system 102 includes a circuit board 10. The circuit board 10 can also be referred to as an interposer. The system 102 includes chips 24_1 to 24_N disposed on the circuit board 10. The chips 24_1 to 24_N can be electrically connected with each other. Signals/commands/messages can be transmitted between chips 24_1 to 24_N. Each of the chips 24_1 to 24_N can be of different functionalities. Some of the chips 24_1 to 24_N can be of identical or similar functionalities.

The chip 24_1 may include a plurality of systems 15. Each of the systems 15 can be of different functionalities. Some of the systems 15 can be of identical or similar functionalities. The chip 24_1 may include a phase lock circuit 16. The phase lock circuit 16 can be a circuit that is configured to generate an output signal whose phase is related to the phase of an input signal. The phase lock circuit 16 can be configured to receive the output signal 12_O of the signal source 12 and then provide an output signal 16_O. The output signal 16_O can have a frequency different from that of the output signal 12_O. The output signal 16_O can have a frequency greater than that of the output signal 12_O. The frequency of the output signal 16_O can be a multiple of that of the output signal 12_O.

The output signal 12_O can be provided to the circuit board 10 through, for example, distribution traces or TSVs.

The chip 24_1 may include a plurality of buffering circuits 18. The buffering circuits 18 can be electrically connected between the phase lock circuit 16 and the systems 15. The buffering circuits 18 can be configured to amplify the amplitudes of the output signal 16_O before providing the output signal 16_O to the systems 15. The buffering circuits 18 may facilitate maintaining the slew rate of the output signal 16_O before the output signal 16_O is provided to the systems 15.

The chip 24_1 may further include a dividing circuit 22. The dividing circuit 22 can be a frequency divider. A frequency divider can be a circuit that takes an input signal of a frequency fin and generates an output signal of a frequency fout, where fout=fin/n, and "n" is an integer. The frequency of the output signal 22_O of the dividing circuit 22 can be lower than that of the input signal 22_I. The frequency of the output signal 22_O can be substantially identical to that of the output signal 12_O.

Although a buffering circuit 18 is depicted in FIG. 2 as connected between the phase lock circuit 16 and the dividing circuit 22, it can be contemplated that the dividing circuit 22 can be directly connected to the phase lock circuit 16. The dividing circuit 22 can receive a signal directly from the phase lock circuit 16.

The chip 24_1 may include a buffering circuit 17 electrically connected with the dividing circuit 22. The buffering circuit 17 can be configured to provide a signal to an output terminal 24_1T of the chip 24_1. The signal provided at the output terminal 24_1T will be received by the chip of the next stage (i.e., chip 24_2, not shown in FIG. 2). The buffering circuit 17 can be configured to amplify the amplitudes of the output signal 22_O before providing the output signal 22_O to the chip of the next stage. The signal outputted by the buffering circuit 17 can have a frequency substantially identical to that of the output signal 22_O. The buffering circuit 17 may facilitate maintaining the slew rate of the output signal 22_O before the output signal 22_O is provided to the chip of the next stage.

The system 102 further includes a buffering circuit 23 disposed on the circuit board 10. The buffering circuit 23 can be disposed between two adjacent chips. The buffering circuit 23 can be configured to amplify the amplitudes of the signals transmitted between two adjacent chips. The buffering circuit 23 can be configured to maintain the slew rate of the signals transmitted between two adjacent chips. Although only one buffering circuit 23 is depicted in FIG. 2, it can be contemplated that two or more buffering circuits can be disposed between two adjacent chips.

The chip 24_N may include a plurality of systems 15, a phase lock circuit 16, and a plurality of buffering circuits 18. The functions/properties of the systems 15, the phase lock circuit 16, and the buffering circuits 18 are similar to those described in accordance with FIG. 1, and thus the details are not repeated here.

Figure 3:
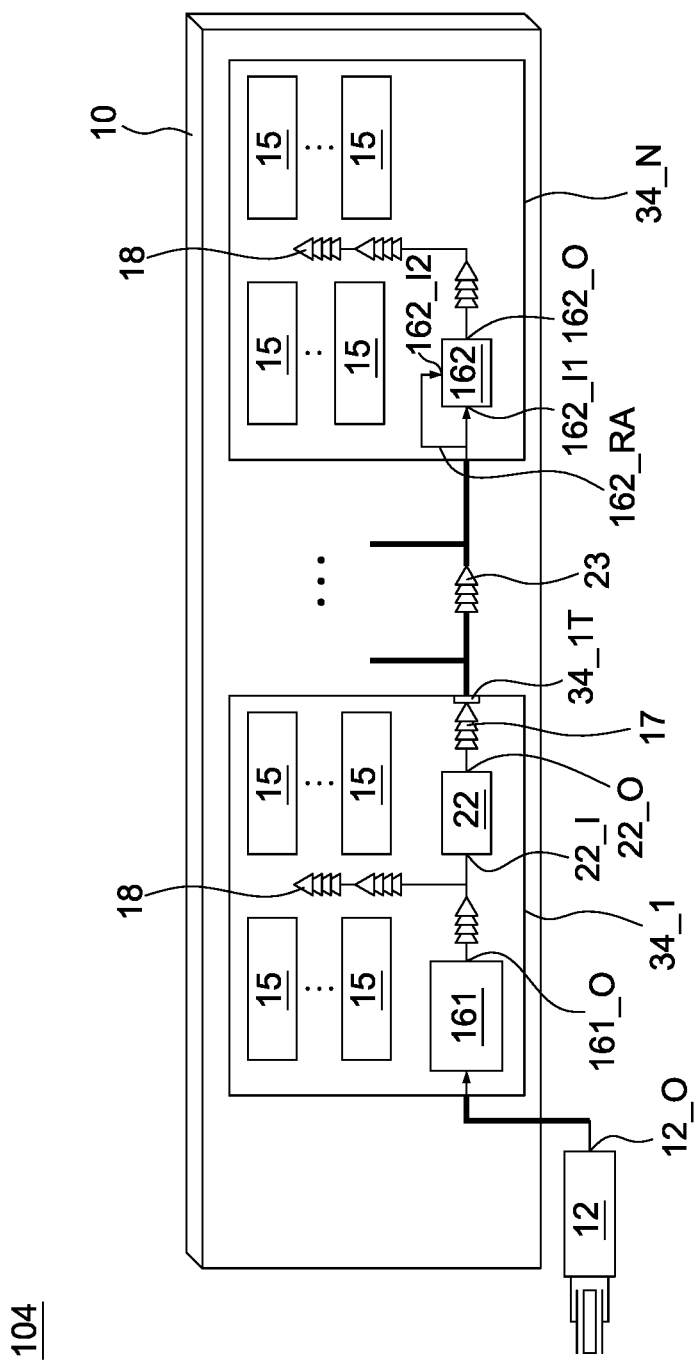
FIG. 3 illustrates a schematic view of a system, in accordance with some embodiments of the present disclosure.

FIG. 3 illustrates a schematic view of a system, in accordance with some embodiments of the present disclosure.

FIG. 3 shows a system 104. The system 104 can be an electrical system. The system 104 can be a system of ICs. The system 104 can be a system deployed using 2.5D packaging technology. The system 104 includes a signal source 12. The signal source 12 can be a source of a clock signal. The signal source 12 can be a source of a periodic signal. The signal source 12 can be a clock generator.

The system 104 includes a circuit board 10. The circuit board 10 can also be referred to as an interposer. The system 104 includes chips 34_1 to 34_N disposed on the circuit board 10. The chips 34_1 to 34_N can be electrically connected with each other. Signals/commands/messages can be transmitted between chips 34_1 to 34_N. Each of the chips 34_1 to 34_N can be of different functionalities. Some of the chips 34_1 to 34_N can be of identical or similar functionalities.

The chip 34_1 may include a plurality of systems 15. Each of the systems 15 can be of different functionalities. Some of the systems 15 can be of identical or similar functionalities. The chip 34_1 may include a phase lock circuit 161. The phase lock circuit 161 can be a circuit that is configured to generate an output signal whose phase is related to the phase of an input signal. The phase lock circuit 161 can be configured to receive the output signal 12_O of the signal source 12 and then provide an output signal 161_O. The output signal 161_O can have a frequency different from that of the output signal 12_O. The output signal 161_O can have a frequency greater than that of the output signal 12_O. The frequency of the output signal 161_O can be a multiple of that of the output signal 12_O.

The output signal 12_O can be provided to the circuit board 10 through, for example, distribution traces or TSVs.

The phase lock circuit 161 can be a phase lock loop (PLL) with an integrated LC oscillator (or LC-tank oscillator). An LC oscillator can be an oscillator that has lower phase noise and a narrow tuning range. An LC oscillator can sometimes occupy a greater area within a chip.

The chip 34_1 may further include a dividing circuit 22. The dividing circuit 22 can be a frequency divider. The frequency of the output signal 22_O of the dividing circuit 22 can be lower than that of the input signal 22_I. The frequency of the output signal 22_O can be substantially identical to that of the output signal 12_O.

Although a buffering circuit 18 is depicted in FIG. 3 as connected between the phase lock circuit 161 and the dividing circuit 22, it can be contemplated that the dividing circuit 22 can be directly connected to the phase lock circuit 161. The dividing circuit 22 can receive a signal directly from the phase lock circuit 161.

The chip 34_1 may include a buffering circuit 17 electrically connected with the dividing circuit 22. The buffering circuit 17 can be configured to provide a signal to an output terminal 34_1T of the chip 34_1. The signal provided at the output terminal 34_1T will be received by the chip of the next stage (i.e., chip 34_2, not shown in FIG. 3). The buffering circuit 17 can be configured to amplify the amplitudes of the output signal 22_O before providing the output signal 22_O to the chip of the next stage. The buffering circuit 17 may facilitate maintaining the slew rate of the output signal 22_O before the output signal 22_O is provided to the chip of the next stage.

The system 104 further includes a buffering circuit 23 disposed on the circuit board 10. The buffering circuit 23 can be disposed between two adjacent chips. The buffering circuit 23 can be configured to amplify the amplitudes of the signals transmitted between two adjacent chips. The buffering circuit 23 can be configured to maintain the slew rate of the signals transmitted between two adjacent chips. Although only one buffering circuit 23 is depicted in FIG. 3, it can be contemplated that two or more buffering circuits can be disposed between two adjacent chips.

The chip 34_N may include a plurality of systems 15, a phase lock circuit 162, and a plurality of buffering circuits 18. The phase lock circuit 162 can be a PLL with an integrated ring oscillator (RO). An RO can sometimes have higher phase noise and a wide tuning range. A RO can sometimes occupy a smaller area within a chip.

The phase lock circuit 162 includes a re-alignment signal path 162_RA. The re-alignment signal path 162_RA can be connected between an input terminal 162_I1 and another input terminal 162_I2 of the phase lock circuit 162. The re-alignment signal path 162_RA may lower the phase noise of the RO within the phase lock circuit 162 to a level similar to a level of an LC oscillator. The re-alignment signal path 162_RA can reduce the noise/jitter of the phase lock circuit 162. The re-alignment signal path 162_RA can increase the accuracy of the signal output by the output terminal 162_O of the phase lock circuit 162.

Figure 4:
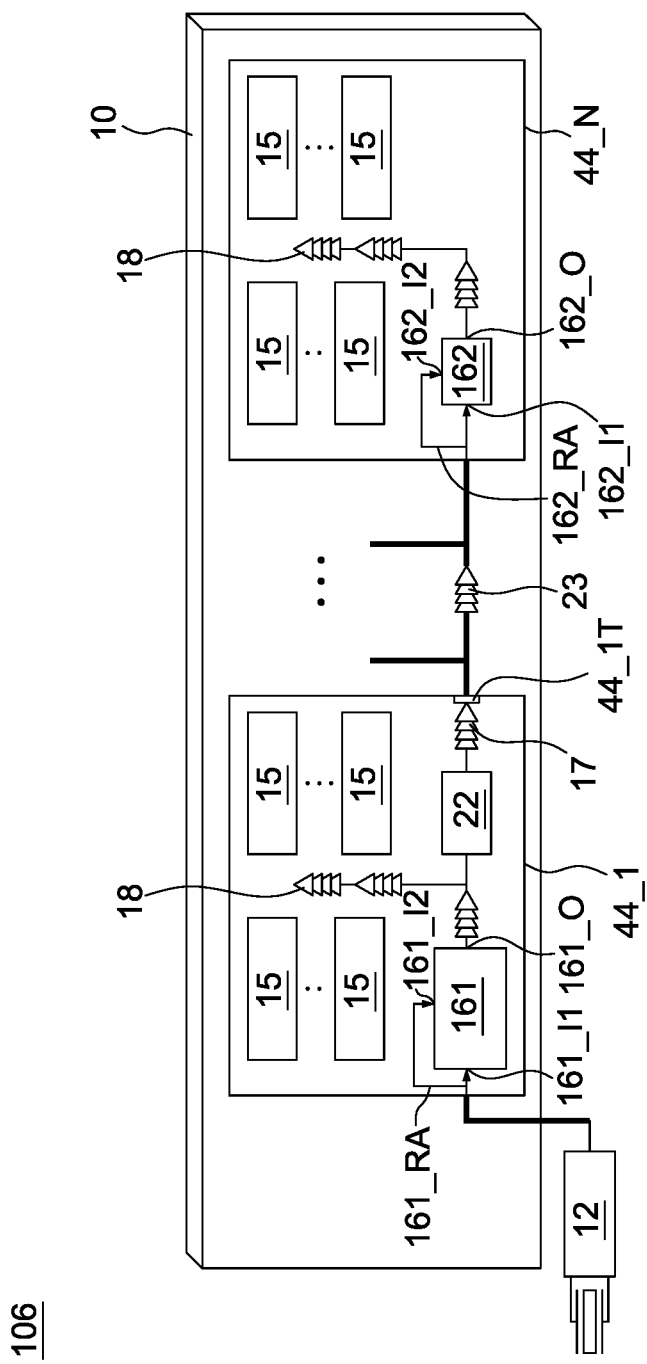
FIG. 4 illustrates a schematic view of a system, in accordance with some embodiments of the present disclosure.

FIG. 4 illustrates a schematic view of a system, in accordance with some embodiments of the present disclosure.

FIG. 4 shows a system 106. The system 106 can be an electrical system. The system 106 can be a system of ICs. The system 106 can be a system deployed using 2.5D packaging technology. The system 106 includes a signal source 12. The signal source 12 can be a source of a clock signal. The signal source 12 can be a source of a periodic signal. The signal source 12 can be a clock generator.

The system 104 includes a circuit board 10. The circuit board 10 can also be referred to as an interposer. The system 104 includes chips 44_1 to 44_N disposed on the circuit board 10. The chips 44_1 to 44_N can be electrically connected with each other.

The chip 44_1 includes a plurality of systems 15, a phase lock circuit 161, a buffering circuit 17, a plurality of buffering circuits 18, and a dividing circuit 22. The phase lock circuit 161 can be a PLL with an integrated LC oscillator. An LC oscillator can be an oscillator that has lower phase noise and a narrow tuning range. The buffering circuit 17 can be configured to provide a signal to an output terminal 44_1T of the chip 44_1. The signal provided at the output terminal 44_1T will be received by the chip of the next stage (i.e., chip 44_2, not shown in FIG. 4).

The chip 44_1 is similar to the chip 34_1, except that the chip 44_1 further includes a re-alignment signal path 161_RA. The re-alignment signal path 161_RA can be connected between an input terminal 161_I1 and another input terminal 161_I2 of the phase lock circuit 161.

The re-alignment signal path 161_RA can further decrease the phase noise of the LC oscillator within the phase lock circuit 161. The re-alignment signal path 161_RA can reduce the noise/jitter of the phase lock circuit 161. The re-alignment signal path 161_RA can increase the accuracy of the signal output by the output terminal 161_O of the phase lock circuit 161.

The system 106 further includes a buffering circuit 23 disposed on the circuit board 10. The buffering circuit 23 can be disposed between two adjacent chips. The buffering circuit 23 can be configured to amplify the amplitudes of the signals transmitted between two adjacent chips. The buffering circuit 23 can be configured to maintain the slew rate of the signals transmitted between two adjacent chips. Although only one buffering circuit 23 is depicted in FIG. 4, it can be contemplated that two or more buffering circuits can be disposed between two adjacent chips.

The chip 44_N may include a plurality of systems 15, a phase lock circuit 162, and a plurality of buffering circuits 18. The phase lock circuit 162 can be a PLL with an integrated RO. The phase lock circuit 162 includes a re-alignment signal path 162_RA. The re-alignment signal path 162_RA can be connected between an input terminal 162_I1 and another input terminal 162_I2 of the phase lock circuit 162. The re-alignment signal path 162_RA may lower the phase noise of the RO within the phase lock circuit 162 to a level similar to a level of an LC oscillator. The re-alignment signal path 162_RA can reduce the noise/jitter of the phase lock circuit 162. The re-alignment signal path 162_RA can increase the accuracy of the signal output by the output terminal 162_O of the phase lock circuit 162.

Figures 5A, 5B:
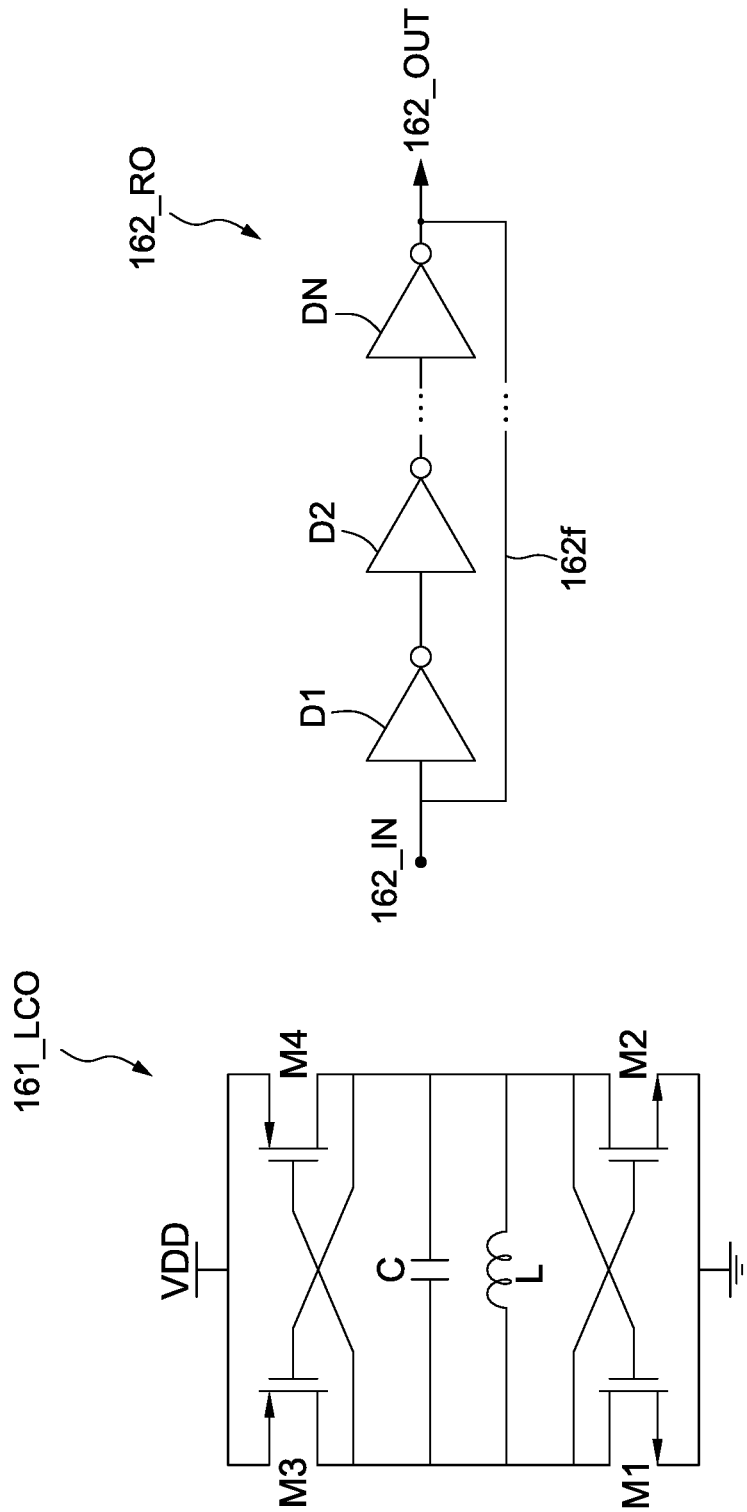
FIG. 5A illustrates a schematic view of an LC oscillator, in accordance with some embodiments of the present disclosure.
FIG. 5B illustrates a schematic view of a ring oscillator (RO), in accordance with some embodiments of the present disclosure.

FIG. 5A illustrates a schematic view of an LC oscillator, in accordance with some embodiments of the present disclosure.

FIG. 5A shows an LC oscillator 161_LCO. The LC oscillator 161_LCO includes an inductor L and a capacitor C, and thus can be referred to as an LC oscillator. The LC oscillator 161_LCO includes transistors M1, M2, M3 and M4. The LC oscillator 161_LCO can have a lower phase noise and a narrow tuning range. The LC oscillator 161_LCO can be included in the phase lock circuit 161 as described in accordance with FIGS. 3 and 4.

The frequency of the signals provided by the LC oscillator 161_LCO can be calculated in accordance with the equation below:

$$freq = \frac{1}{2\pi \times \sqrt{LC}} \quad \text{(equation 1)}$$

FIG. 5B illustrates a schematic view of a ring oscillator (RO), in accordance with some embodiments of the present disclosure.

FIG. 5B shows a ring oscillator 162_RO. The ring oscillator 162_RO includes an input terminal 162_IN, an output terminal 162_OUT, and several delay units connected in series. The ring oscillator 162_RO may include delay units D1, D2, . . . DN. The delay units D1, D2, . . . DN can also be referred to as delay circuits, delay cells, delay blocks or delay devices in subsequent paragraphs of the present disclosure. The delay units D1, D2, . . . DN can be connected in series. The number N is a positive integer. In some embodiments, the number N can be an odd positive integer. The delay unit D1 can be connected to the delay unit DN by a feedback loop 162f.

The frequency of the signals provided by the output terminal 162_OUT can be calculated in accordance with the equation below:

$$freq = 1/(2*N*Td) \quad \text{(equation 2)}$$

In equation 2, N is the number of the delay units and Td is the delay time of each of the delay units D1, D2, . . . DN. The ring oscillator 162_RO can be included in the phase lock circuit 162 as described in accordance with FIGS. 3 and 4.

Figure 6A:
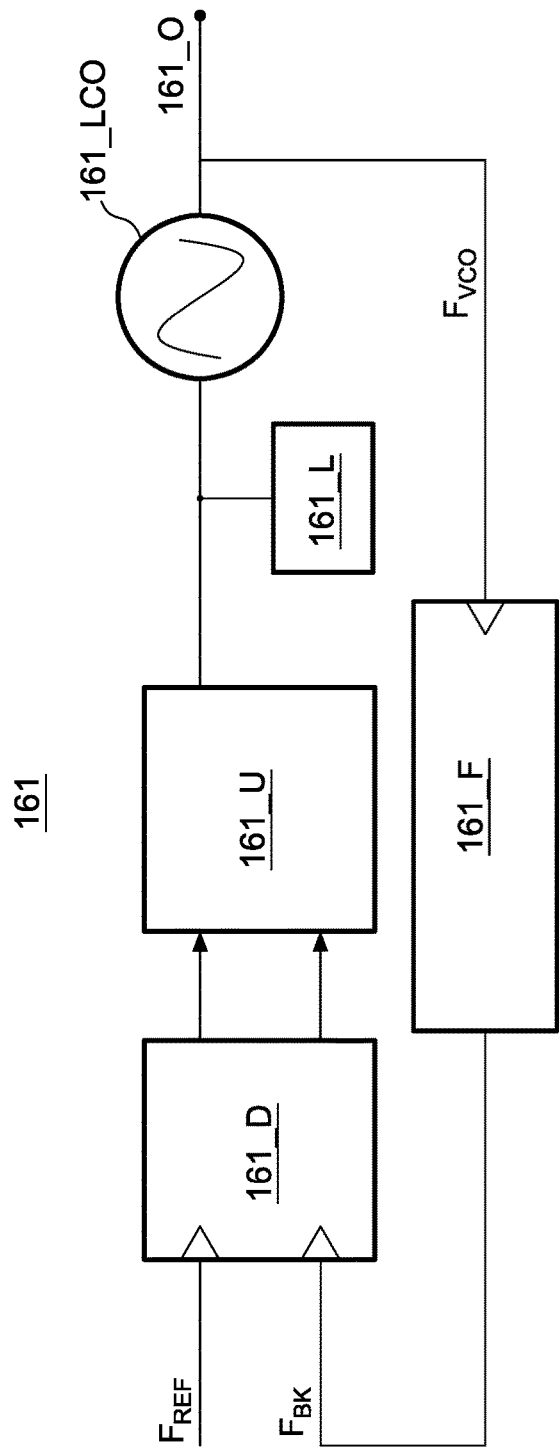
FIG. 6A illustrates a schematic view of a phase lock circuit, in accordance with some embodiments of the present disclosure.

FIG. 6A illustrates a schematic view of a phase lock circuit, in accordance with some embodiments of the present disclosure.

FIG. 6A shows a phase lock circuit 161. The phase lock circuit 161 includes a detector 161_D, a charge pump 161_U, a loop filter 161_L, an LC oscillator 161_LCO, and a feedback divider 161_F.

The detector 161_D can be a phase and frequency detector. The detector 161_D can be configured to compare the phase/frequency of the signal $F_{BK}$ with the phase/frequency of the signal $F_{REF}$. The charge pump 161_U is configured to adjust the LC oscillator 161_LCO to make the phases matched. The loop filter 161_L is configured to determine the stability of the loop. The LC oscillator 161_LCO can be configured to generate a periodic signal $F_{VCO}$. The feedback divider 161_F is connected between the LC oscillator 161_LCO and the detector 161_D. The feedback divider 161_F can be configured to lower the frequency of the signal $F_{VCO}$.

Figure 6B:
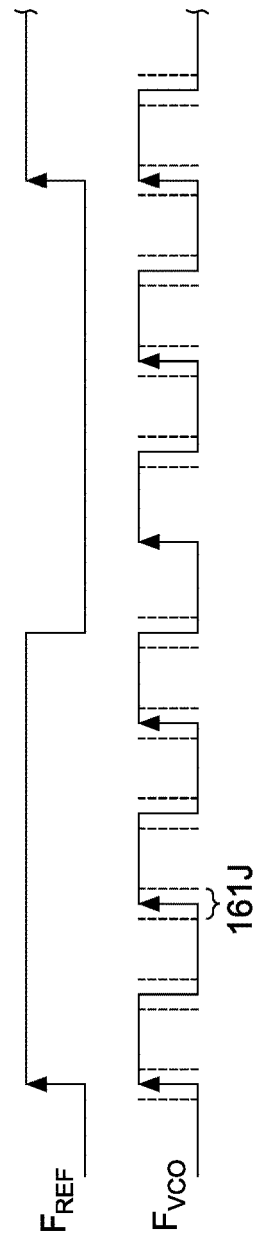
FIG. 6B illustrates a schematic view of waveforms of a phase lock circuit, in accordance with some embodiments of the present disclosure.

FIG. 6B illustrates a schematic view of waveforms of a phase lock circuit, in accordance with some embodiments of the present disclosure.

FIG. 6B shows the waveforms of the signals $F_{REF}$ and $F_{VCO}$. The signal $F_{REF}$ can be a periodic signal with a relatively lower frequency. The signal $F_{VCO}$ can be a periodic signal with a relatively higher frequency. The signal $F_{REF}$ can be a periodic signal provided by a clock generator, for example the signal source 12. The jitter 161J indicates the noise that may be accumulated within the phase lock circuit 161. The jitter 161J may be accumulated as the signals transmitted through the detector 161_D, the charge pump 161_U, the loop filter 161_L, and the LC oscillator 161_LCO.

Figure 7A:
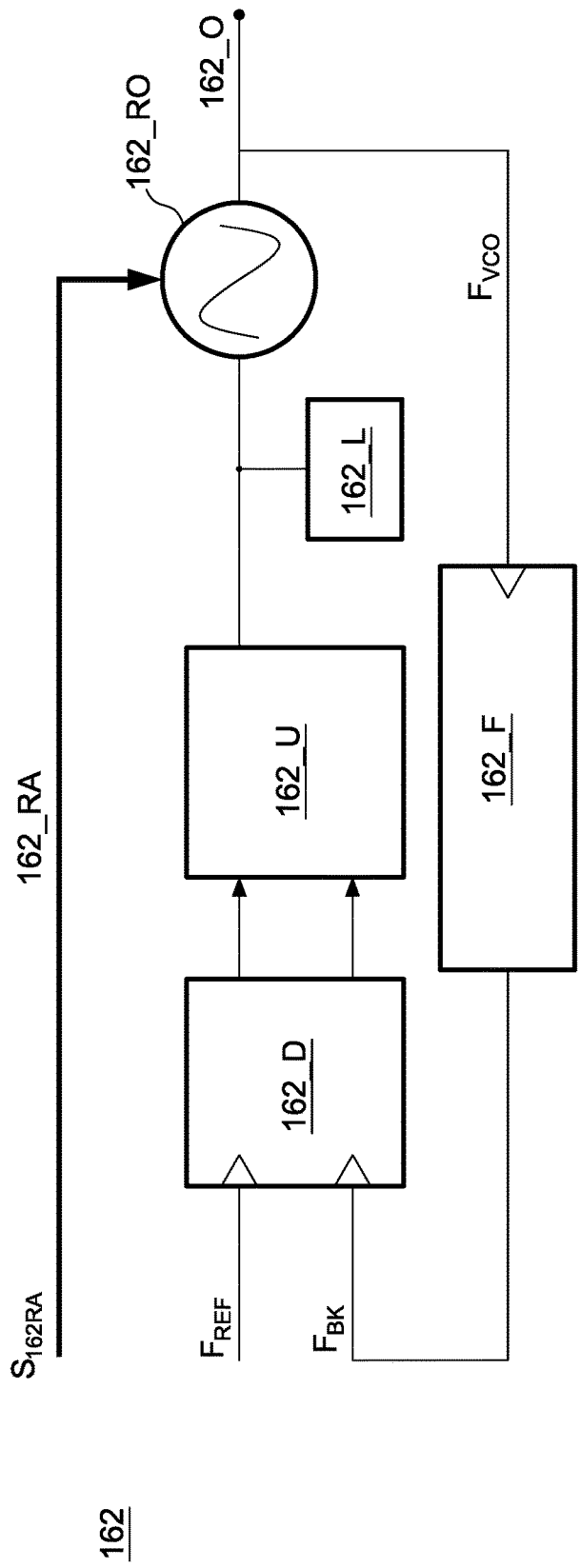
FIG. 7A illustrates a schematic view of a phase lock circuit, in accordance with some embodiments of the present disclosure.

FIG. 7A illustrates a schematic view of a phase lock circuit, in accordance with some embodiments of the present disclosure.

FIG. 7A shows a phase lock circuit 162. The phase lock circuit 162 includes a detector 162_D, a charge pump 162_U, a loop filter 162_L, a ring oscillator 162_RO, and a feedback divider 162_F. The phase lock circuit 162 further includes a re-alignment signal path 162_RA. The re-alignment signal path 162_RA can be used to provide a signal $S_{162RA}$ to the oscillator 162_RO. The signal $S_{162RA}$ can be provided to the oscillator 162_RO, for example, via the input terminal 162_I2 of the phase lock circuit 162 (see FIG. 3).

The detector 162_D can be a phase and frequency detector. The detector 162_D can be configured to compare the phase/frequency of the signal $F_{BK}$ with the phase/frequency of the signal $F_{REF}$. The signal $F_{REF}$ can be provided to the detector 162_D, for example, via the input terminal 162_I1 of the phase lock circuit 162 (see FIG. 3).

The charge pump 162_U is configured to adjust the ring oscillator 162_RO to make the phases matched. The loop filter 162_L is configured to determine the stability of the loop. The ring oscillator 162_RO can be configured to generate a periodic signal $F_{VCO}$. The feedback divider 162_F is connected between the ring oscillator 162_RO and the detector 162_D. The feedback divider 162_F can be configured to lower the frequency of the signal $F_{VCO}$.

Figure 7B:
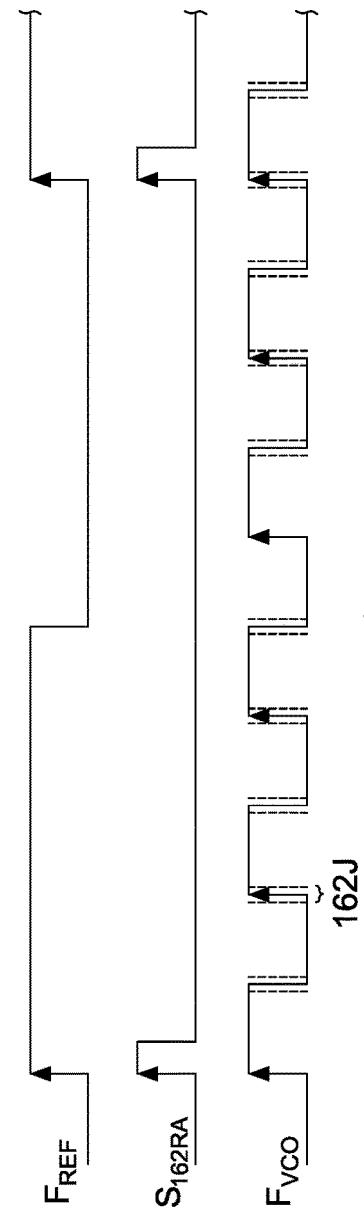
FIG. 7B illustrates a schematic view of waveforms of a phase lock circuit, in accordance with some embodiments of the present disclosure.

FIG. 7B illustrates a schematic view of waveforms of a phase lock circuit, in accordance with some embodiments of the present disclosure.

FIG. 7B shows the waveforms of the signals $F_{REF}$ and $F_{VCO}$. FIG. 7B also shows the waveform of a signal $S_{162RA}$ that is provided on the re-alignment signal path 162_RA.

The signal $F_{REF}$ can be a periodic signal with a relatively lower frequency. The signal $S_{162RA}$ can be a periodic pulse signal having a frequency identical to that of the signal $F_{REF}$. The signal $F_{REF}$ can be a periodic signal provided by a clock generator, for example the signal source 12. The signal $F_{VCO}$ can be a periodic signal with a relatively higher frequency.

The jitter 162J indicates the noise that may be accumulated within the phase lock circuit 162. The jitter 162J may be accumulated as the signals transmitted through the ring oscillator 162_RO. By incorporating the re-alignment signal path 162_RA, the jitter of the phase lock circuit 162 can be greatly reduced by eliminating the jitters that can be produced when the signals pass through the detector 162_D, the charge pump 162_U, and the loop filter 162_L.

Figure 8:
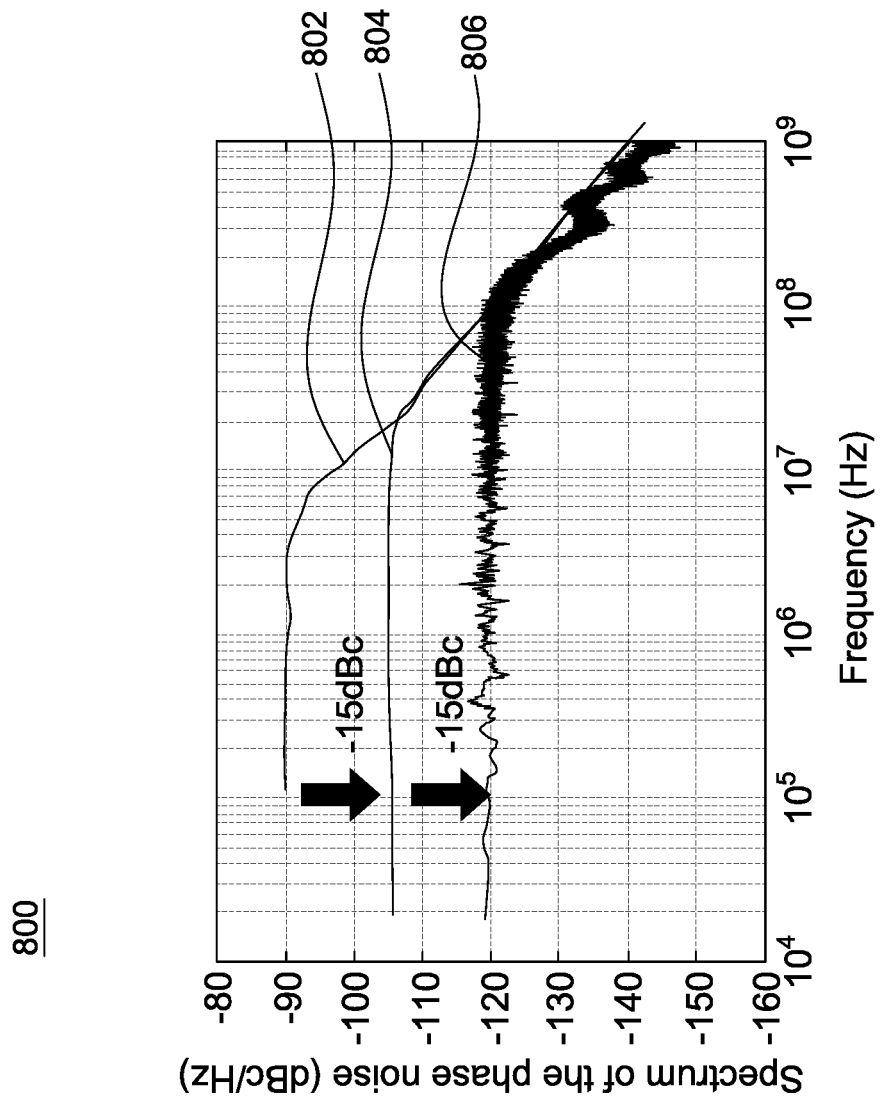
FIG. 8 illustrates a schematic view of simulation results of the phase noises of different configurations of a phase lock circuit, in accordance with some embodiments of the present disclosure.

FIG. 8 illustrates a schematic view of simulation results of the phase noises of different configurations of a phase lock circuit, in accordance with some embodiments of the present disclosure.

FIG. 8 shows a diagram 800. The vertical axis of the diagram 800 represents the spectrum of the phase noise, and the horizontal axis represents the frequency (Hz). The phase noise is expressed in dBc per Hz, in which dBc refers to decibels relative to the carrier. The dBc is the power ratio of a signal to a carrier signal, expressed in the unit of decibels.

The diagram 800 includes curves 802, 804 and 806. The curve 802 can be obtained from a phase lock circuit without a re-alignment signal path. The curve 802 can be obtained from a phase lock circuit with an input reference signal (i.e., $F_{REF}$) having a frequency of 50 MHz.

The curve 804 can be obtained from a phase lock circuit with a re-alignment signal path. The curve 804 can be obtained from a phase lock circuit with an input reference signal (i.e., $F_{REF}$) having a frequency of 50 MHz. The curve 806 can be obtained from a phase lock circuit with a re-alignment signal path. The curve 806 can be obtained from a phase lock circuit with an input reference signal (i.e., $F_{REF}$) having a frequency of 300 MHz.

Based on the curves 802 and 804, it can be found that in a condition wherein the frequency of the input signals is the same, a phase lock circuit with a re-alignment signal path can have a better phase noise. The phase noise of the curve 804 can be lower than that of the curve 802 by around 15 dBc.

Based on the curves 804 and 806, it can be found that in a condition wherein a phase lock circuit has a re-alignment signal path, an increase in the frequency of the input reference signal (i.e., $F_{REF}$) can further decrease the phase noise of the phase lock circuit. The phase noise of the curve 806 can be lower than that of the curve 804 by around 15 dBc.

Figure 9A:
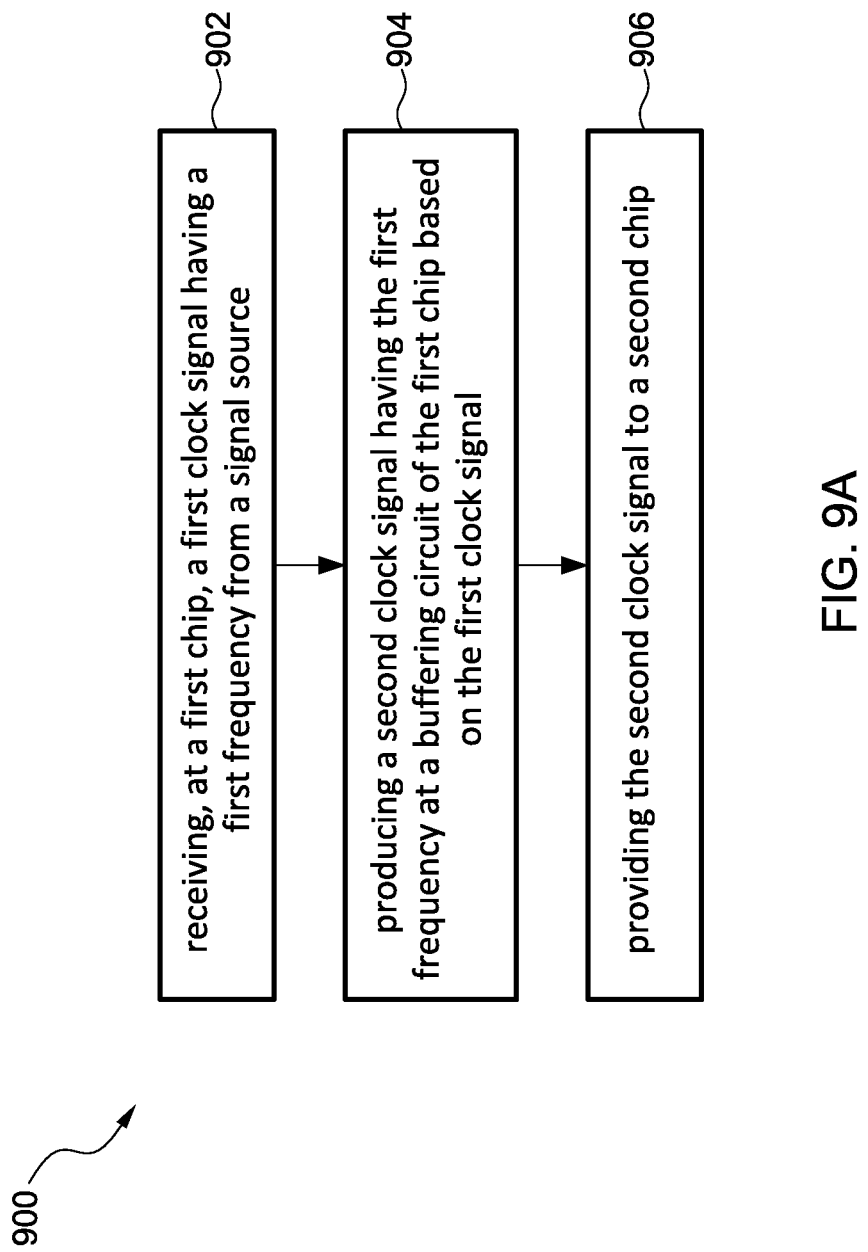
FIG. 9A illustrates a flow chart including operations for operating a system, in accordance with some embodiments of the present disclosure.

FIG. 9A illustrates a flow chart including operations for operating a system, in accordance with some embodiments of the present disclosure. FIG. 9A shows a flow chart 900. The flow chart 900 includes operations 902, 904 and 906.

In the operation 902, a first clock signal having a first frequency is received at a first chip from a signal source. For example, a signal 12_O having a first frequency can be received at the chip 14_1 from the signal source 12.

In the operation 904, a second clock signal having the first frequency is produced at a buffering circuit of the first chip based on the first clock signal. For example, a second clock signal having the first frequency can be produced at the buffering circuit 17a or 17b of the chip14_1 based on the signal 12_O.

In the operation 906, the second clock signal is provided to a second chip. For example, a second clock signal produced by the buffering circuit 17a or 17b of the chip14_1 can be provided to the chip 142.

Figure 9B:
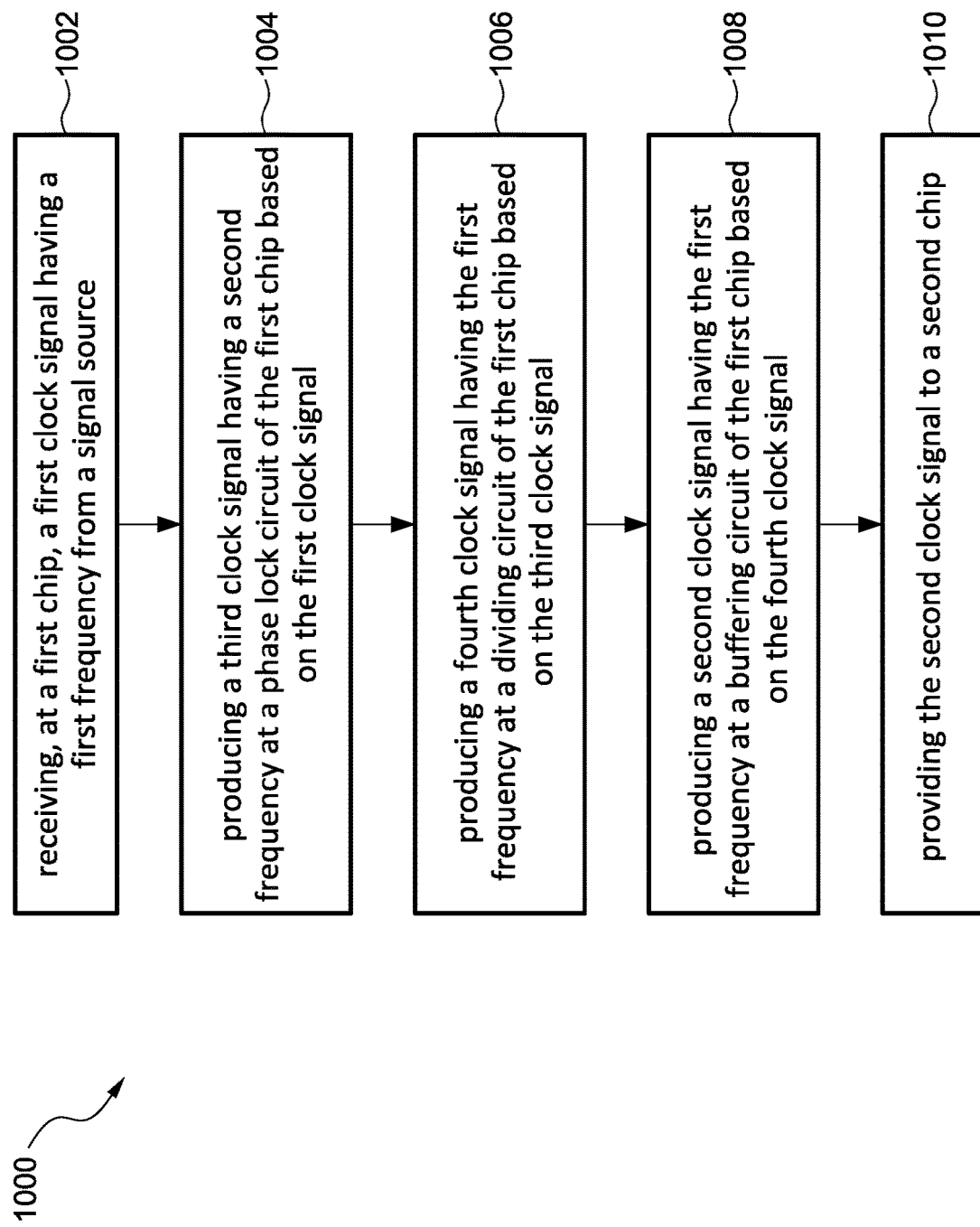
FIG. 9B illustrates a flow chart including operations for operating a system, in accordance with some embodiments of the present disclosure.

FIG. 9B illustrates a flow chart including operations for operating a system, in accordance with some embodiments of the present disclosure. FIG. 9B shows a flow chart 1000. The flow chart 1000 includes operations 1002, 1004, 1006, 1008 and 1010.

In the operation 1002, a first clock signal having a first frequency is received at a first chip from a signal source. For example, a signal 12_O having a first frequency can be received at the chip 24_1 from the signal source 12.

In the operation 1004, a third clock signal having a second frequency is produced at a phase lock circuit of the first chip based on the first clock signal. For example, a signal 16_O having a second frequency can be produced at the phase lock circuit 16 of the chip 24_1 based on the signal 12_O. The second frequency can be greater than the first frequency.

In the operation 1006, a fourth clock signal having the first frequency is produced at a dividing circuit of the first chip based on the third clock signal. For example, a signal 22_O having the first frequency can be produced by the dividing circuit 22 of the chip 24_1 based on the signal 16_O.

In the operation 1008, a second clock signal having the first frequency is produced at a buffering circuit of the first chip based on the fourth clock signal. For example, the buffering circuit 17 of the chip 24_1 can produce a signal based on the signal 22_O, and has a frequency substantially identical to that of the signal 22_O.

In the operation 1010, the second clock signal is provided to a second chip. For example, a clock signal produced by the buffering circuit 17 of the chip 241 can be provided to a chip next to the chip 24_1.

FIG. 10A illustrates a schematic view of a system, in accordance with some comparative embodiments of the present disclosure.

FIG. 10A shows a system 400. The system 400 can be an electrical system. The system 400 can be a system of ICs. The system 400 can be a system deployed using 2.5D packaging technology. The system 400 includes a plurality of signal sources 12_1, . . . , 12_N. Each of the signal sources 12_1, . . . , 12_N can be a source of a clock signal. Each of the signal sources 12_1, . . . , 12_N can be a source of a periodic signal. Each of the signal sources 121, . . . , 12_N can be a clock generator.

The system 400 includes a circuit board 20. The circuit board 20 can also be referred to as an interposer. The system 400 includes chips 54_1 to 54_N disposed on the circuit board 20. The chips 54_1 to 54_N can be electrically connected with each other. Signals/commands/messages can be transmitted between chips 541 to 54_N.

The chip 54_1 includes a plurality of systems 25, a phase lock circuit 26, and a plurality of buffering circuits 28. The phase lock circuit 26 can be configured to receive a signal from the signal source 12_1. The signal outputted by the phase lock circuit 26 can have a frequency different from that of the signal from the signal source 12_1. The signal outputted by the phase lock circuit 26 can have a frequency greater than that of the signal from the signal source 12_1. The frequency of the signal outputted by the phase lock circuit 26 can be a multiple of that of the signal from the signal source 12_1.

The buffering circuits 28 can be configured to amplify the amplitudes of the signal outputted from the phase lock circuit 26. Signals amplified by the buffering circuits 28 can be provided to the systems 25.

The chip 54_N can include components/circuits identical to or similar to those of the chip 54_1. The chip 54_N can operate with the signal provided by the signal source 12_N.

In the system 400, each of the chips 54_1 to 54_N are provided with a separate signal source 12_1 to 12_N. With separate signal sources 12_1 to 12_N, each of the chips 54_1 to 54_N can operate with precise clock signals. However, a large number of signal sources may occupy excessive space within the system 400. In addition, a large number of signal sources may consume excessive energy when the system 400 operates.

Figure 10B:
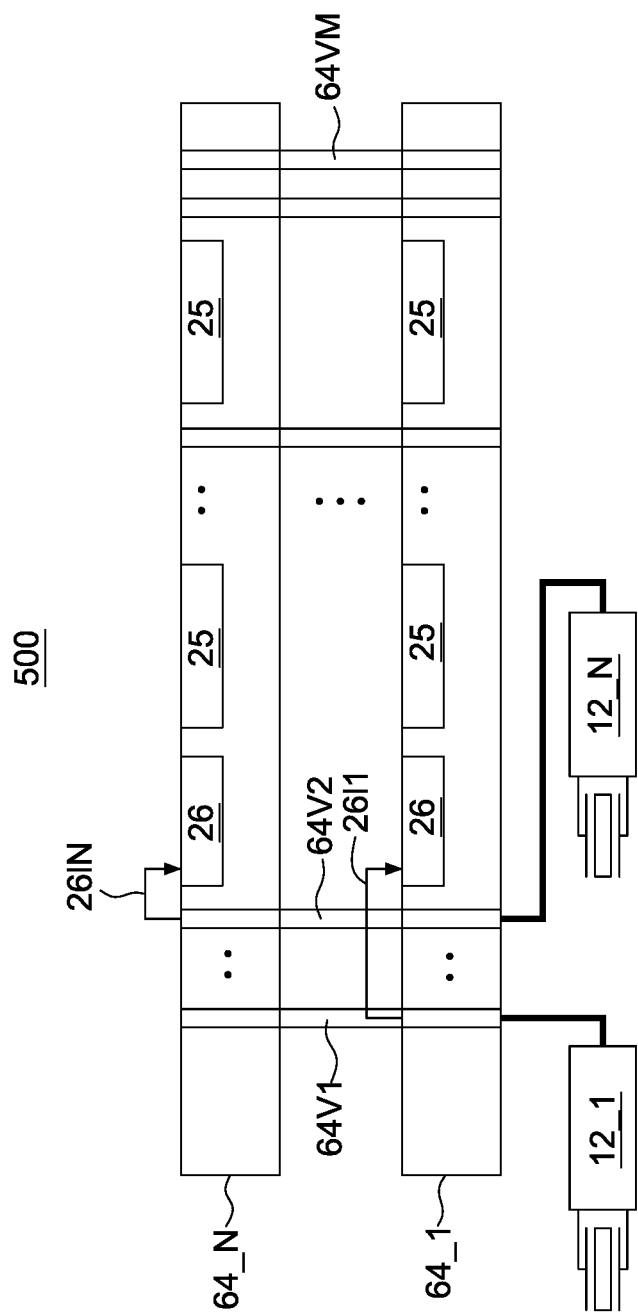
FIG. 10B illustrates a schematic view of a system, in accordance with some comparative embodiments of the present disclosure.

FIG. 10B illustrates a schematic view of a system, in accordance with some comparative embodiments of the present disclosure.

FIG. 10B shows a system 500. The system 500 can be an electrical system. The system 500 can be a system of ICs. The system 500 can be a system deployed using 3D packaging technology. The system 500 includes a plurality of signal sources 12_1, . . . , 12_N. Each of the signal sources 12_1, . . . , 12_N can be a source of a clocking signal. Each of the signal sources 12_1, . . . , 12_N can be a clock generator.

The system 500 includes chips 641 to 64_N. The chips 64_1 to 64_N can be electrically connected with each other by TSVs 64V1, 64V2, . . . 64VM. Signals/commands/messages can be transmitted between chips 64_1 to 64_N.

The chip 64_1 includes a phase lock circuit 26 and a plurality of systems 25. The signal of the signal source 12_1 can be provided to the phase lock circuit 26 of the chip 64_1 through the TSV 64V1 and the signal path 2611. The chip 64_N includes a phase lock circuit 26 and a plurality of systems 25. The signal of the signal source 12_N can be provided to the phase lock circuit 26 of the chip 64_N through the TSV 64V2 and the signal path 261N.

In the system 500, each of the chips 64_1 to 64_N are provided with a separate signal source 12_1 to 12_N. With separate signal sources 12_1 to 12_N, each of the chips 64_1 to 64_N can operate with precise clock signals. However, a large number of signal sources may occupy excessive space within the system 500. In addition, a large number of signal sources may consume excessive energy when the system 500 operates.

Figure 11A:
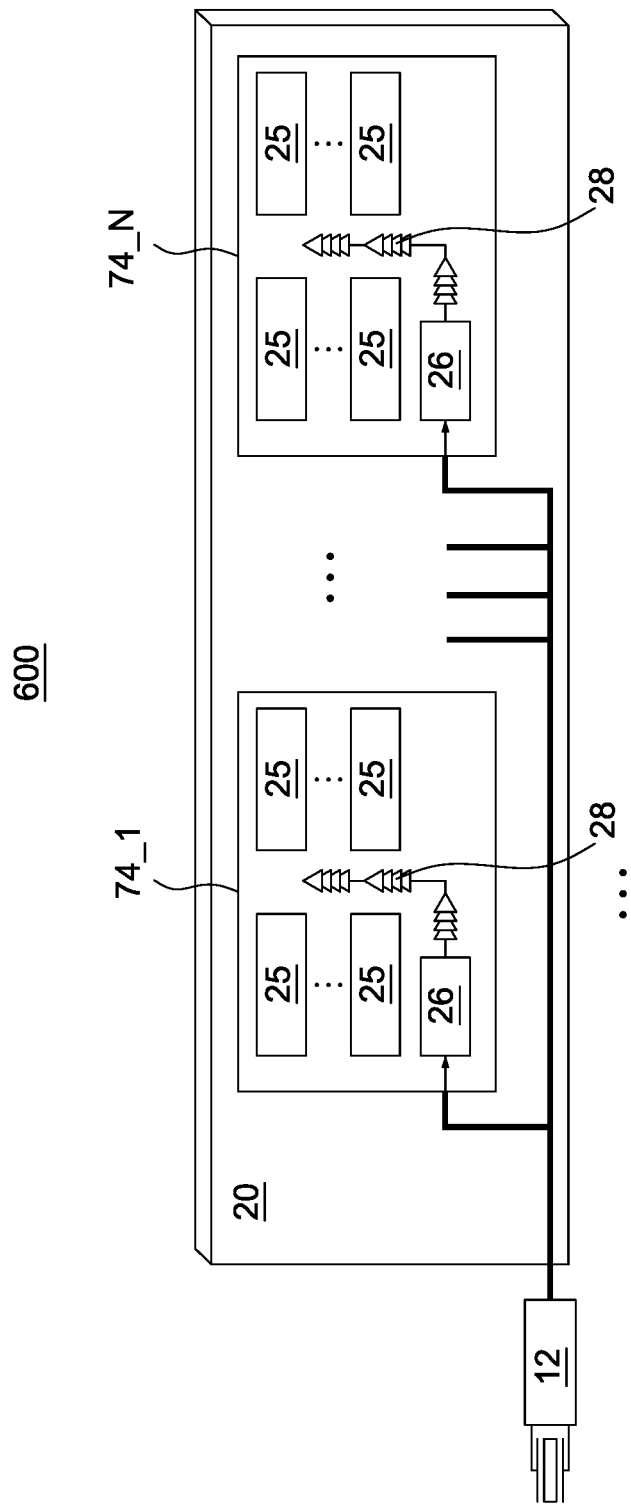
FIG. 11A illustrates a schematic view of a system, in accordance with some comparative embodiments of the present disclosure.

FIG. 11A illustrates a schematic view of a system, in accordance with some comparative embodiments of the present disclosure.

FIG. 11A shows a system 600. The system 600 can be an electrical system. The system 600 can be a system of ICs. The system 600 can be a system deployed using 2.5D packaging technology. The system 600 includes a signal source 12. The signal source 12 can be a source of a clocking signal. The signal source 12 can be a clock generator.

The system 600 includes a circuit board 20. The circuit board 20 can also be referred to as an interposer. The system 600 includes chips 74_1 to 74_N disposed on the circuit board 20. The chips 74_1 to 74_N can be electrically connected with each other. Signals/commands/messages can be transmitted between chips 741 to 74_N.

The chip 74_1 includes a plurality of systems 25, a phase lock circuit 26, and a plurality of buffering circuits 28. The phase lock circuit 26 can be configured to receive a signal from the signal source 12. The signal outputted by the phase lock circuit 26 can have a frequency different from that of the signal from the signal source 12. The signal outputted by the phase lock circuit 26 can have a frequency greater than that of the signal from the signal source 12. The frequency of the signal outputted by the phase lock circuit 26 can be a multiple of that of the signal from the signal source 12.

The buffering circuits 28 can be configured to amplify the amplitudes of the signal outputted from the phase lock circuit 26. Signals amplified by the buffering circuits 28 can be provided to the systems 25.

The chip 74_N can include components/circuits identical to or similar to those of the chip 74_1. The chip 74_N can operate with the signal provided by the signal source 12.

Referring to FIG. 11A, each of the chips 74_1 to 74_N operates with the signal provided by the signal source 12. The signal provided by the signal source 12 may propagate through the signal path 74R before it reaches the chips 74_1 to 74_N. With a single signal source 12, the system 600 may have a compact size as compared to the system 400 of the FIG. 10A. However, the quality of the signal provided by the signal source 12 may degrade as it propagates through the signal path 74R. As a result, the performance of the chips 741 to 74_N may be adversely affected.

Figure 11B:
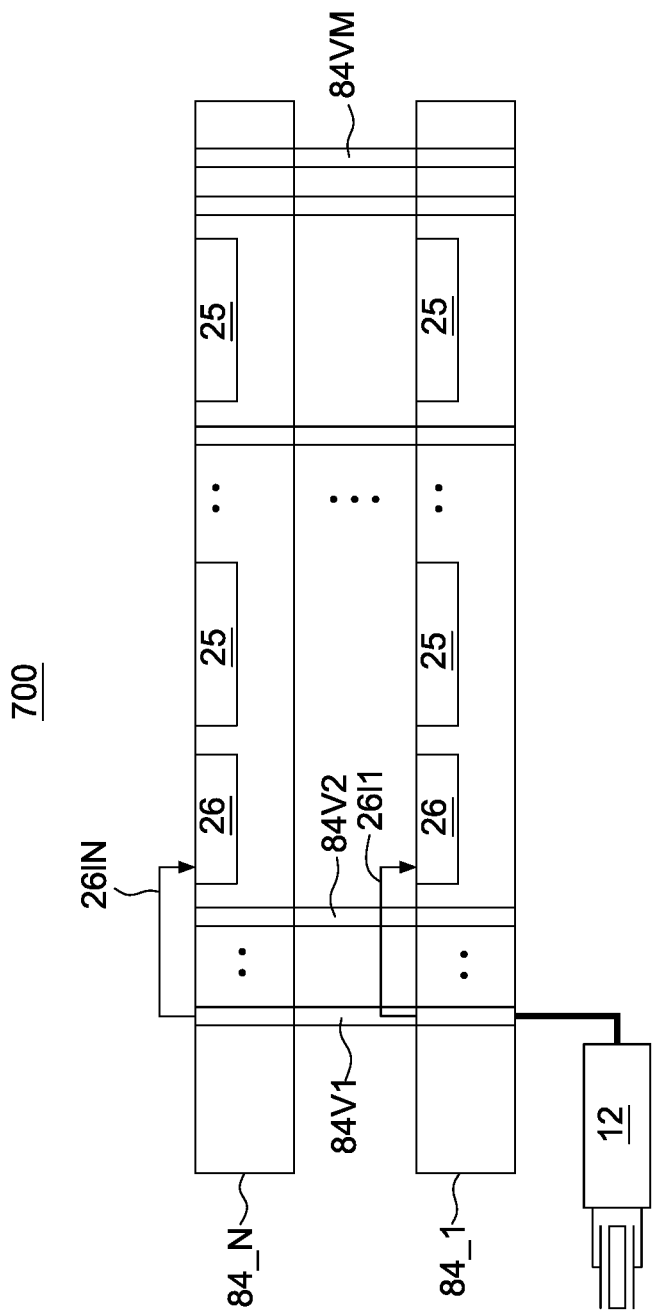
FIG. 11B illustrates a schematic view of a system, in accordance with some comparative embodiments of the present disclosure.

FIG. 11B illustrates a schematic view of a system, in accordance with some comparative embodiments of the present disclosure.

FIG. 11B shows a system 700. The system 700 can be an electrical system. The system 700 can be a system of ICs. The system 700 can be a system deployed using 3D packaging technology. The system 700 includes a single signal source 12. The signal source 12 can be a source of a clocking signal. The signal source 12 can be a clock generator.

The system 700 includes chips 841 to 84_N. The chips 84_1 to 84_N can be electrically connected with each other by TSVs 84V1, 84V2, . . . 84 VM. Signals/commands/messages can be transmitted between chips 84_1 to 84_N.

The chip 84_1 includes a phase lock circuit 26 and a plurality of systems 25. The signal of the signal source 12 can be provided to the phase lock circuit 26 of the chip 84_1 through the TSV 84V1 and the signal path 2611. The chip 84_N includes a phase lock circuit 26 and a plurality of systems 25. The signal of the signal source 12 can be provided to the phase lock circuit 26 of the chip 84_N through the TSV 84V1 and the signal path 261N.

Referring to FIG. 11B, each of the chips 84_1 to 84_N operates with the signal provided by the signal source 12. The signal provided by the signal source 12 may propagate through the TSV 84V1 before it reaches the chips 84_1 to 84_N. With a single signal source 12, the system 700 may have a compact size as compared to the system 500 of the FIG. 10B. However, the quality of the signal provided by the signal source 12 may degrade as it propagates through the TSV 84V1. As a result, the performance of the chips 841 to 84_N may be adversely affected.

Some embodiments of the present disclosure provide an electrical system. The electrical system comprises a first phase lock circuit embedded within a first chip for receiving a first periodic signal having a first frequency. The electrical system comprises a first buffering circuit embedded within the first chip for receiving a second periodic signal having the first frequency, wherein the first buffering circuit is configured to provide a third periodic signal having the first frequency to an output terminal of the first chip.

Some embodiments of the present disclosure provide an electrical system. The electrical system comprises a first chip configured to receive a first periodic signal having a first frequency. The electrical system comprises a first buffering circuit on the first chip configured to amplify the first periodic signal and provide a second periodic signal having the first frequency to an output terminal of the first chip.

Some embodiments of the present disclosure provide a method for operating an electrical system. The method comprises receiving, at a first chip, a first clock signal having a first frequency from a signal source. The method comprises producing a second clock signal having the first frequency at a buffering circuit of the first chip based on the first clock signal. The method comprises providing the second clock signal to a second chip.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrical system, comprising:
a first phase lock circuit embedded within a first chip for receiving a first periodic signal having a first frequency;
a first buffering circuit embedded within the first chip for receiving a second periodic signal having the first frequency and configured to provide a third periodic signal having the first frequency to an output terminal of the first chip;
a second phase lock circuit embedded within a second chip for receiving the third periodic signal from the first chip; and
a second buffering circuit embedded within the second chip, configured to receive a fourth periodic signal having the first frequency and generate a fifth periodic signal having the first frequency by amplifying the fourth periodic signal.

2. The electrical system of claim 1, wherein the first buffering circuit is configured to amplify the second periodic signal and then generate the third periodic signal.

3. The electrical system of claim 1, further comprising:
a dividing circuit embedded within the first chip, wherein the dividing circuit is configured to receive a seventh periodic signal provided by the first phase lock circuit and then provide the second periodic signal to the first buffering circuit, wherein the seventh periodic signal has a second frequency greater than the first frequency.

4. The electrical system of claim 1, further comprising a first signal path connected between a first input terminal and a second input terminal of the first phase lock circuit.

5. The electrical system of claim 4, wherein the first input terminal of the first phase lock circuit is configured to receive the first periodic signal having the first frequency, and the second input terminal of the first phase lock circuit is configured to receive a first periodic pulse signal having the first frequency.

6. The electrical system of claim 1, further comprising a second signal path connected between a first input terminal and a second input terminal of the second phase lock circuit.

7. The electrical system of claim 6, wherein the first input terminal of the second phase lock circuit is configured to receive the third periodic signal having the first frequency, and the second input terminal of the second phase lock circuit is configured to receive a second periodic pulse signal having the first frequency.

8. The electrical system of claim 1, further comprising a third buffering circuit external to the first chip, wherein the third buffering circuit is configured to amplify the third periodic signal received at the output terminal of the first chip.

9. The electrical system of claim 1, wherein the first phase lock circuit comprises an oscillator of a first type and the second phase lock circuit comprises an oscillator of a second type different from the first type.

10. An electrical system, comprising:
a first chip configured to receive a first periodic signal having a first frequency;
a first buffering circuit on the first chip configured to amplify the first periodic signal and provide a second periodic signal having the first frequency to an output terminal of the first chip;
a first phase lock circuit on the first chip for producing a third periodic signal having a second frequency based on the first periodic signal;
a second buffering circuit external to the first chip and configured to produce a fifth periodic signal based on the second periodic signal; and
a second chip configured to receive the fifth periodic signal.

11. The electrical system of claim 10, wherein the second frequency is greater than the first frequency.

12. The electrical system of claim 10, further comprising a dividing circuit on the first chip for producing a fourth periodic signal having a third frequency based on the third periodic signal, wherein the third frequency is substantially identical to the first frequency.

13. The electrical system of claim 12, further comprising a second phase lock circuit embedded within a second chip for receiving the fourth periodic signal from the first chip.

14. The electrical system of claim 10, further comprising a first signal path connected between a first input terminal and a second input terminal of the first phase lock circuit.

15. The electrical system of claim 14, wherein the first input terminal of the first phase lock circuit is configured to receive the first periodic signal having the first frequency, and the second input terminal of the first phase lock circuit is configured to receive a first periodic pulse signal having the first frequency.

16. A method for operating an electrical system, comprising:
receiving, at a first chip, a first clock signal having a first frequency from a signal source;
producing a second clock signal having a second frequency different than the first frequency at a phase lock circuit of the first chip based on the first clock signal;
producing a third clock signal having the second frequency at a first buffering circuit of the first chip by amplifying the second clock signal;
producing a fourth clock signal having the first frequency at a dividing circuit of the first chip based on the third clock signal;
producing a fifth clock signal having the first frequency at a second buffering circuit of the first chip by amplifying the fourth clock signal; and
providing the fifth clock signal to an output terminal of the first chip.

17. The method of claim 16, wherein the second frequency is greater than the first frequency.

18. The method of claim 16, further comprising:
providing the first periodic signal having the first frequency to a first input terminal of the phase lock circuit; and
providing a first periodic pulse signal having the first frequency to a second input terminal of the phase lock circuit.

19. The method of claim 16, further comprising:
producing a sixth clock signal having the first frequency at a third buffering circuit external to the first chip by amplifying the fifth clock signal; and
providing the sixth clock signal to a second chip.

20. The method of claim 19, further comprising:
producing a seventh clock signal having a third frequency different than the first frequency at a phase lock circuit of the second chip based on the sixth clock signal; and
producing an eighth clock signal having the third frequency at a first buffering circuit of the second chip by amplifying the seventh clock signal.

* * * * *